US010310387B2

(12) United States Patent
Palmer et al.

(10) Patent No.: US 10,310,387 B2
(45) Date of Patent: Jun. 4, 2019

(54) DYNAMIC PATTERNING METHOD THAT REMOVES PHASE CONFLICTS AND IMPROVES PATTERN FIDELITY AND CDU ON A TWO PHASE-PIXELATED DIGITAL SCANNER

(71) Applicant: Nikon Corporation, Tokyo (JP)

(72) Inventors: Shane R. Palmer, Oro Valley, AZ (US); Julia A. Sakamoto, Tucson, AZ (US); Donis G. Flagello, Half Moon Bay, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 16/006,646

(22) Filed: Jun. 12, 2018

(65) Prior Publication Data

US 2018/0292760 A1 Oct. 11, 2018

Related U.S. Application Data

(62) Division of application No. 14/628,163, filed on Feb. 20, 2015, now abandoned.

(60) Provisional application No. 61/942,531, filed on Feb. 20, 2014.

(51) Int. Cl.
*G03F 7/20* (2006.01)

(52) U.S. Cl.
CPC ...... *G03F 7/70466* (2013.01); *G03F 7/70283* (2013.01); *G03F 7/70291* (2013.01); *G03F 7/70483* (2013.01)

(58) Field of Classification Search
CPC ............. G03F 7/70283; G03F 7/70291; G03F 7/70483; G03F 7/70466
USPC .................................. 355/27, 77; 716/54, 55
See application file for complete search history.

(56) References Cited

U.S. PATENT DOCUMENTS

| | | | |
|---|---|---|---|
| 5,468,578 | A | 11/1995 | Rolfson |
| 8,089,616 | B2 | 1/2012 | Owa |
| 8,405,816 | B2 | 3/2013 | Hirukawa et al. |
| 8,792,081 | B2 | 9/2014 | Owa |
| 2002/0123012 | A1 | 9/2002 | Sewell |
| 2005/0153246 | A1 | 7/2005 | Eib |
| 2013/0222781 | A1 | 8/2013 | Watanabe |
| 2013/0278912 | A1 | 10/2013 | Owa |
| 2013/0314683 | A1 | 11/2013 | Watanabe et al. |

OTHER PUBLICATIONS

Berman et al., "Optimal phase conflict removal for layout of dark field alternating phase shifting masks," *IEEE Trans. on CAD of ICs and Systems*, 19(2): 175-187 (Feb. 2000).

Ghaida et al., "Single-mas double-patterning lithography for reduced cost and improved overlay control," *Proc. of SPIE*, 7488:1-11 (2009).

Poonawala et al., "Double-exposure mask synthesis using inverse lithography," *J. Micro. and Nanolith. MEMS MOEMS*, 6(4):043001-1-9 (Oct.-Dec. 2007).

*Primary Examiner* — Colin W Kreutzer
(74) *Attorney, Agent, or Firm* — Klarquist Sparkman, LLP

(57) ABSTRACT

Phase conflicts in pattern transfer with phase masks can be resolve by exposing pattern features with a first pattern and a second pattern, wherein the second pattern is selected based on the phase conflicts. In scanned exposures using pulsed lasers, a number of exposures of the second pattern can be less than 20% of a total number of exposures.

17 Claims, 11 Drawing Sheets

100
PULSED LASER 102
BEAM SHAPING OPTICS 104
106
PROGRAMMABLE PHASE ARRAY
110
108
PATTERN STORAGE 122
PATTERN AND SCAN CONTROL 120
112
PROJECTION OPTICS
PHASE CONFLICT PATTERN GENERATION 124
114
SENSITIZED SUBSTRATE
SUBSTRATE STAGE
118
116

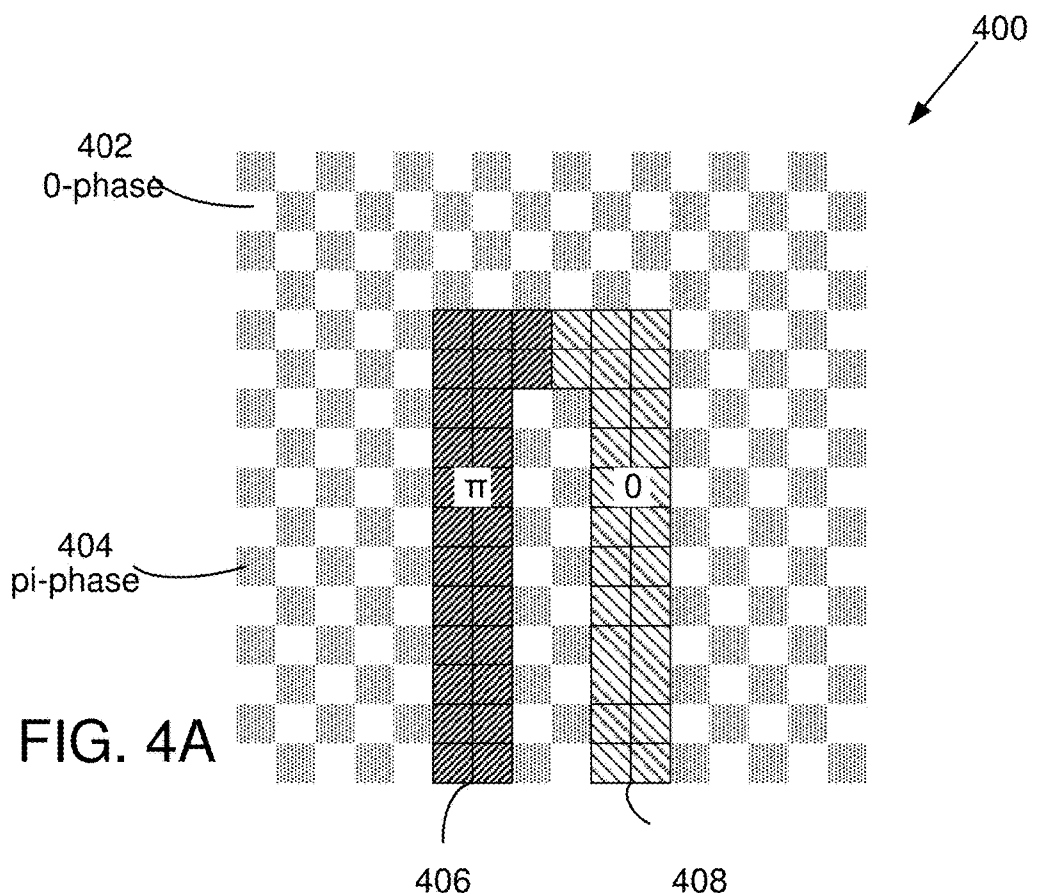
FIG. 4A
FIG. 4B
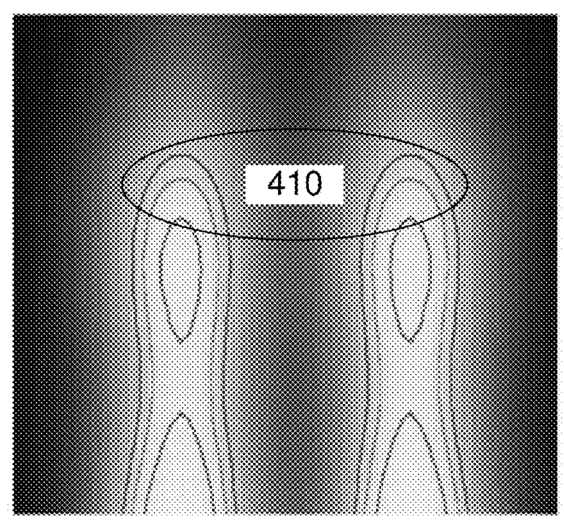

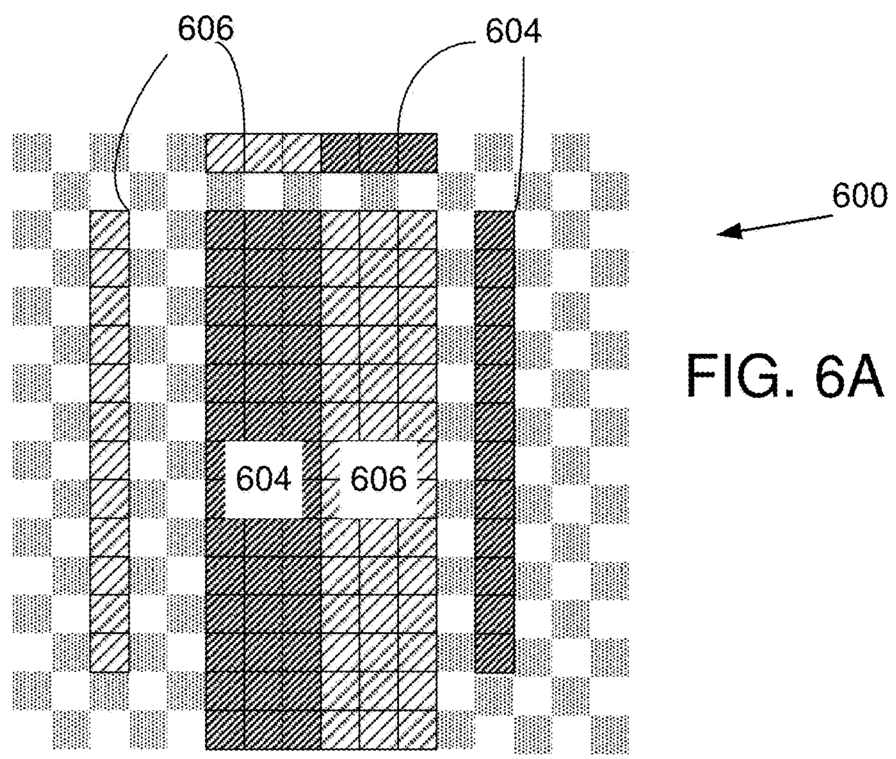
FIG. 6A
FIG. 6B
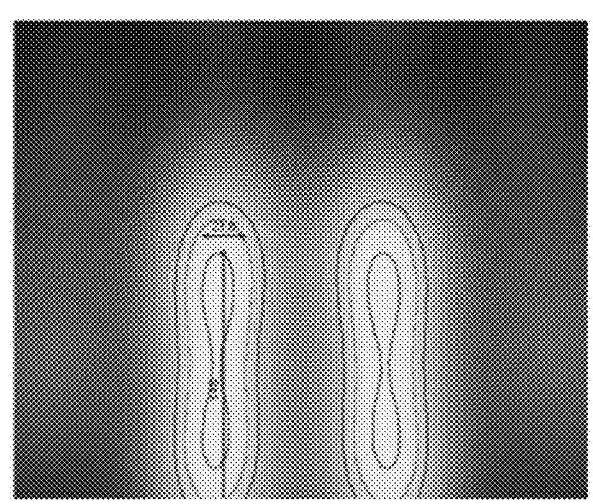

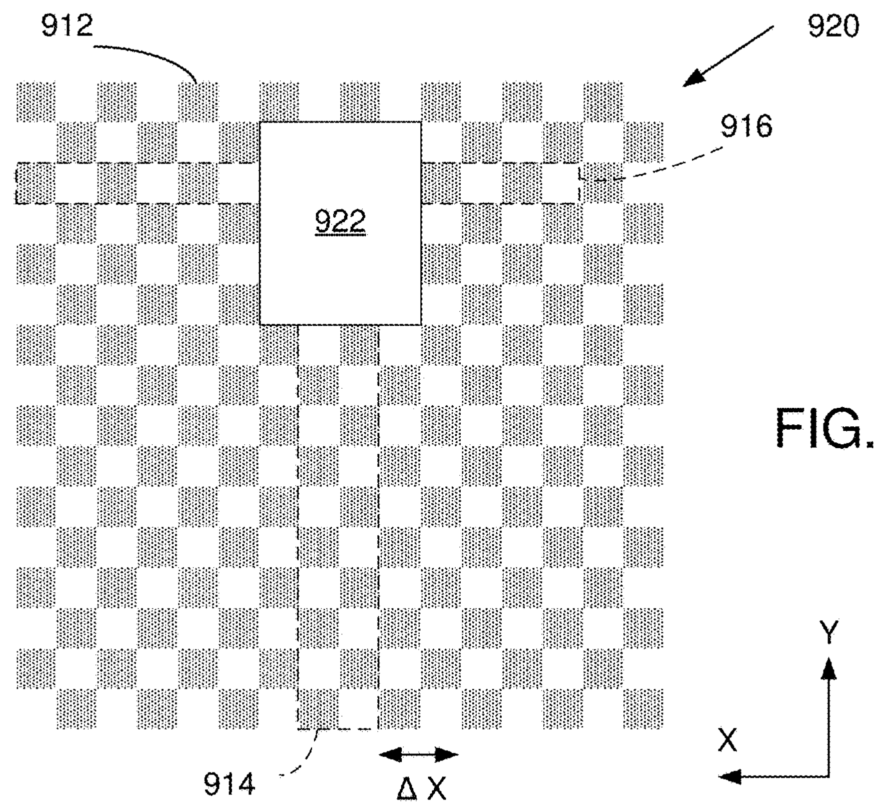
FIG. 9B
FIG. 9C
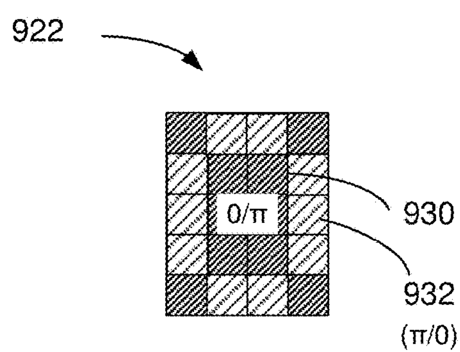

DYNAMIC PATTERNING METHOD THAT REMOVES PHASE CONFLICTS AND IMPROVES PATTERN FIDELITY AND CDU ON A TWO PHASE-PIXELATED DIGITAL SCANNER

CROSS REFERENCE TO RELATED APPLICATION

This is a Divisional of U.S. patent application Ser. No. 14/628,163, filed Feb. 20, 2015, which claims the benefit of U.S. Provisional Patent Application No. 61/942,531, filed Feb. 20, 2014, both of which are incorporated herein by reference.

FIELD

The disclosure pertains to pattern-transfer systems.

BACKGROUND

While phase masks can be used in pattern transfer, binary phase masks can fail to adequately transfer patterns at pattern portions to which both binary phase values are desired. Such phase conflicts can result in device failure and poor manufacturing yield. Although multiple masks can be used in principle, this introduces unacceptable process delays for mask changes as and significantly increases the costs of associated with mask generation.

SUMMARY

Apparatus comprise a digital phase mask comprising a plurality of independently assignable phase pixels. A pattern generator is coupled to the digital phase mask so as to define at least a first phase pattern portion and a second phase pattern portion associated with a pattern feature, wherein the second phase pattern portion is associated with phase conflict in the first phase pattern portion. An optical system is situated to expose a sensitized substrate to the first and second phase pattern portions defined on the digital phase mask. In some examples, the optical system includes a pulsed laser, and the first phase pattern portion and the second phase pattern are exposed onto the substrate with N laser pulses and M laser pulses, respectively, wherein M and N are integers, and M is less than N. In other examples, M is less than 0.2N. In further embodiments, a scanning system scans the digital phase mask and the sensitized substrate with respect to each other, and the optical system provides laser pulses at intervals corresponding to relative scanning of one, two, three, or four phase pixels. According to some examples, the sensitized substrate is exposed to the first phase pattern portion and then to the second phase pattern portion or is alternately exposed to the first and second phase pattern portions. In typical examples, the optical system includes a pulsed laser, and the first phase pattern portion and the second phase pattern portion are exposed onto the substrate with laser pulses having different pulse energies. In representative embodiments, the second phase pattern portion is a bridging pattern portion.

Methods comprise defining first and second phase patterns on a digital phase mask so as to define a pattern feature on a substrate, wherein the second phase pattern is defined so as to compensate at least one phase conflict. The substrate is exposed to a series of exposures corresponding to the first and second phase patterns, wherein a relative displacement of the digital phase mask and the substrate between exposures corresponds to a dimension of at least one phase pixel of the digital phase mask. In some examples, a first and a second number of exposures are assigned to the first and second phase masks, respectively, and the series of exposures is based on the first and second numbers of exposures. In some examples, the substrate is exposed to the first phase pattern and then exposed to the second phase pattern or the substrate is exposed to the second phase pattern and then to the first phase pattern. In typical examples, the substrate is exposed to the first and second phase patterns with respective series of pulses and the second phase pattern is associated with a bridging pattern feature and includes at least two different phases that are assigned to respective pixels of the digital phase mask. In some embodiments, at least three phase patterns are defined on the digital phase mask so as to define the pattern feature on the substrate.

Computer-implemented methods comprise defining a pattern feature for transfer to the substrate and assigning at least one phase pattern to be provided to a digital phase mask for the pattern feature, wherein the phase pattern is associated with a phase conflict. In some examples, at least one phase pattern includes a primary phase pattern and a secondary phase pattern, wherein the secondary phase pattern is associated with a bridging phase pattern to be situated so as to connect phase pattern portions having first and second phases. In typical embodiments, exposures are assigned to the first and second phase patterns. In some cases, the exposures are assigned as numbers of laser pulses and the exposures assigned to the first and second patterns are selected to provide a predetermined total exposure in at least one pattern area associated with the phase conflict. According to some representative examples, a pattern layout for at least a portion of a circuit is received and processed so as to select the pattern feature based on identification of a phase conflict. In some alternatives, the phase pattern is a binary phase pattern.

Apparatus comprise a processor and at least one computer-readable storage medium. The at least one computer readable medium includes processor-executable instructions for obtaining at least a portion of a circuit pattern and identifying a phase conflict in at least one pattern feature in the circuit pattern. At least first and second phase patterns are assigned to the at least one pattern feature. In some embodiments, the apparatus includes a network interface, wherein the at least one computer readable medium includes processor-executable instructions for obtaining the portion of the circuit pattern via the network interface or for transmitting the first and second phase patterns via the network interface. In some examples, the at least one computer readable medium includes processor-executable instructions for obtaining the portion of the circuit pattern from the at least one computer-readable medium. In a specific example, the at least one computer readable medium is random access memory. In representative embodiments, at least one of the first and second phase patterns is associated with a bridging feature in the circuit pattern portion. In additional alternatives, the at least one computer readable medium includes processor-executable instructions for assigning exposures to the first and second phase patterns. A total exposure for at least some portions of a region associated with the phase conflict is associated with a sum of exposure of the first and second phase patterns.

The foregoing and other features and advantages of the disclosure will become more apparent from the following detailed description, which proceeds with reference to the accompanying figures.

BRIEF DESCRIPTION OF THE DRAWINGS

FIGS. 4A-4B illustrate a phase mask and a corresponding exposure intensity.

FIGS. 6A-6B illustrate a phase mask and a corresponding exposure intensity.

FIGS. 9A-9C illustrate phase patterns associated with a phase conflict.

DETAILED DESCRIPTION

Figure 1:
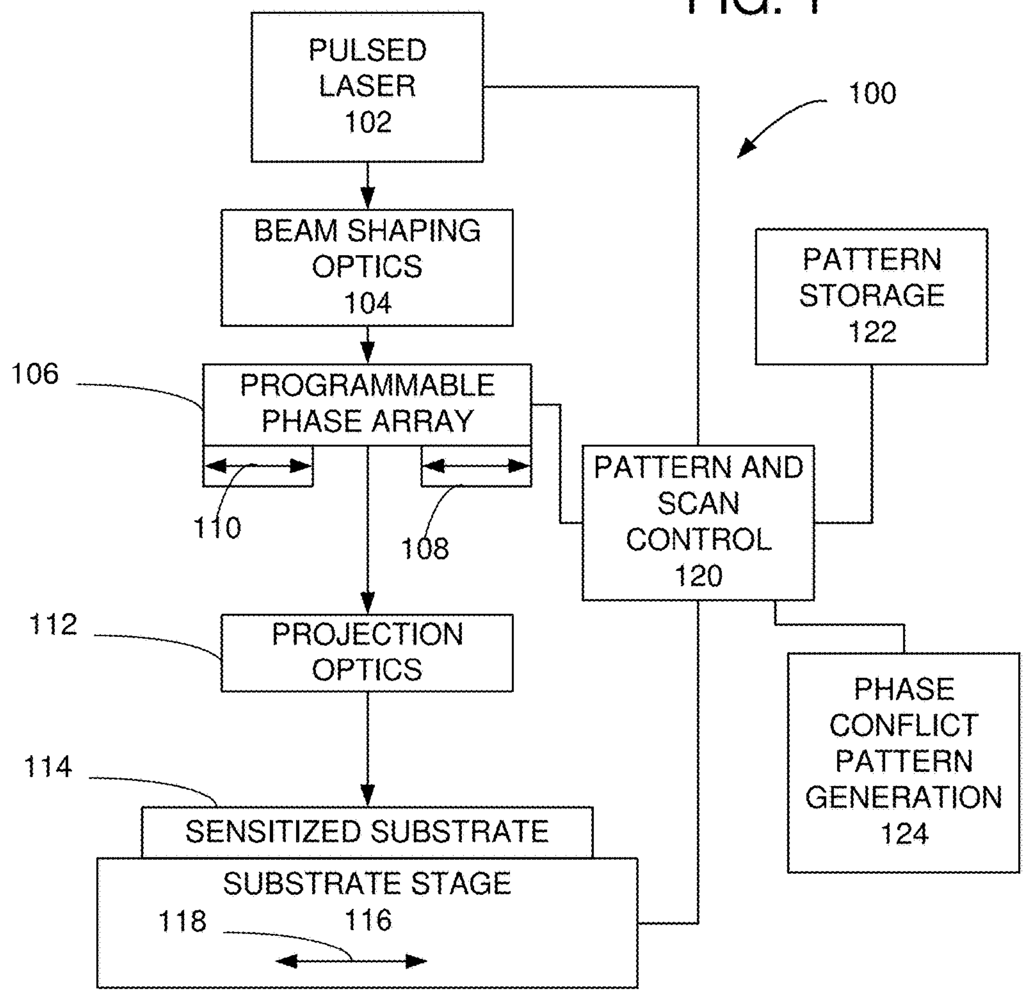
FIG. 1 is a block diagram of a pattern transfer apparatus that transfers patterns from a programmable phase mask to scanned substrate using multiple phase correcting exposures.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

In some examples, the term phase mask refers to a phase pattern defined on a phase array. Typically, exposures of a substrate to a phase mask are made using a series of laser pulses for each associated phase mask. The laser pulses can have the same or different pulse energies so that total substrate exposure is based on both numbers of pulses and associated pulse energies. In the examples, first and second phase patterns are associated with a pattern feature, but two, three or more phase patterns can be used. Typically multiple phase patterns are defined for pattern features having regions for which phase assignments conflict, and choice of an available phase does not produce suitable exposure. Binary phase masks are used in the examples, but phase masks having more than two phase assignments can be used.

As shown in FIG. 1, an exposure apparatus 100 includes a pulsed light source such as pulsed laser 102 that directs an optical beam to beam shaping optics 104 that process the optical beam and direct the optical beam to a programmable phase array 106 that is secured to a pattern stage 108 that can move the programmable phase array 106 along one or more axes, such as axis 110. For convenience, the phase array 106 is also referred to herein as a phase-shift pixelated mask. An optical beam modulated by the programmable phase array 106 is received by projection optics 112 that directs a patterned beam to a sensitized substrate 114 that is coupled to a substrate stage 116 that can move the sensitized substrate along one or more axes, such as axis 118. A controller 120 receives and/or processes pattern data from a pattern storage device 122 and controls the positions of the programmable phase array 106, the sensitized substrate 114, and laser pulse timing (such as pulse repetition rate). In addition, the controller 120 is coupled to the programmable phase array 106 so as to establish pixel phases based on patterns from the pattern storage device 122. In some examples, the programmable phase array 106 is a rectangular array of phase pixels, each pixel of which is typically assigned one of two values, such as 0 phase shift or ½ wave phase shift or some other combination. Multiple phase levels can be used, if desired. The laser source 102 produces an optical beam at a suitable wavelength or wavelength range for exposure of a sensitized layer of the sensitized substrate 114. In order to reduce the effects of phase conflicts, a pattern generator 124 is coupled to provide additional patterns to the phase array. Such patterns are discussed in detail below.

The arrangement of FIG. 1 is shown with a transmissive programmable phase array and refractive optical elements for convenient illustration, but reflective programmable phase arrays and/or reflective optical systems are commonly used, and are especially convenient for exposures at wavelengths below 200 nm, such as 194 nm. Additional beam forming and beam directing optical elements can be used such as mirrors and prisms that fold or bend an optical path, but are omitted for clarity in FIG. 1. Sensitized substrates generally include a semiconductor wafer or other material to which a photosensitive layer has been applied for used in photo-patterning.

Using an apparatus such as that of FIG. 1, the sensitized substrate 114 is moved with respect to a projected image of a pixelated phase pattern based on a pattern establishing by the programmable phase array 106. A final compound pattern at the sensitized substrate 114 is created by projecting the image that is obtained from the programmable phase array 106 in a series of overlapping exposures (exposure shots) corresponding to different laser pulses or sets of laser pulses. The overlapping exposures of the pattern of the programmable phase array 106 are temporally spaced based on a laser pulse repetition rate (for fixed frequency exposures). Between each laser pulse, the sensitized substrate 114 is moved a distance corresponding to a product of a time between laser pulses and a speed of the substrate stage 116. To maintain pattern registration, the pattern defined by the programmable phase array 106 is also shifted from pulse to pulse or otherwise so as to maintain intended exposure on the sensitized substrate 114. For example, if substrate scanning produces a displacement corresponding to a single phase element of the programmable phase array 106 between each pulse, the pattern on the programmable phase array 106 is shifted by one pixel between each pulse. Periodic pulses are not required, and other pulse sequences can be used, with corresponding displacement(s) of the pattern defined by the programmable phase array 106. A final pattern on the sensitized substrate is produced by the combination of exposures from many pulses and associated with a series of displaced phase patterns at the programmable phase array 106. Exposure apparatus having a programmable array are disclosed in, for example, U.S. Pat. Nos. 8,089,616 B2, 8,405,816 B2, and 8,792,081 B2, and United States Patent Application Nos. US 2013/0222781 A1, US 2013/0278912 A1 and US 2013/0314683 A1. The disclosures in U.S. Pat. Nos. 8,089,616 B2, 8,405,816 B2, and 8,792,081 B2, and U.S. Patent Application Nos. US 2013/0222781 A1, US 2013/0278912 A1 and US 2013/0314683 A1 are incorporated herein by reference.

Figure 2A:
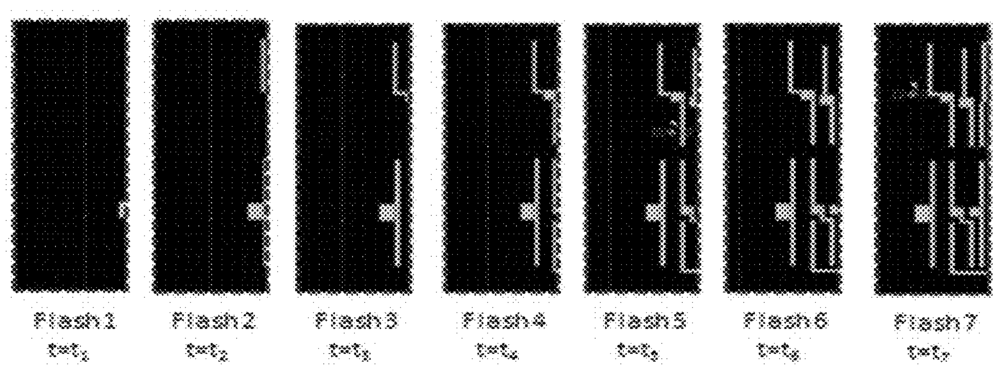
FIGS. 2A-2B-3 illustrate pattern transfer using a programmable phase mask.
Figure 2B:
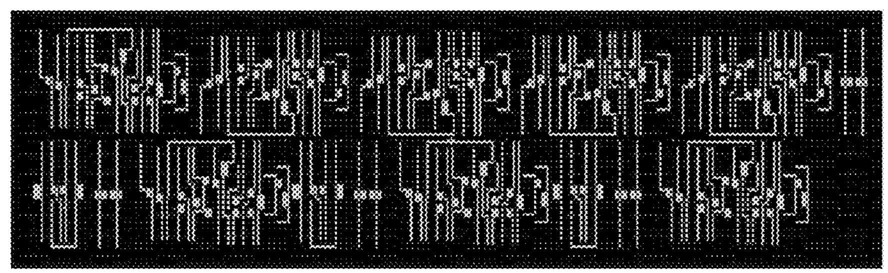

An example of the creation of a pattern by substrate scanning and exposure with a programmable phase array is shown in FIG. 2A which show projected patterns from a series of pulse exposure ("flashes"). As shown in FIG. 2A, a pattern moves from left to right for each flash, and the substrate is scanned a corresponding distance so that the flashes remain aligned on the substrate. Flash 1 contains only a small pattern defined by the phase array, typically including at least in part, a checkerboard pattern of 0- and π-phase pixels. At the time of the Flash 2, the substrate has been moved a distance d under the stationary phase pattern that is equal to the product of stage speed and interflash time, i.e., $d=v(t_2-t_1)$. The wafer has thus been exposed to the pattern of Flash 1 and the translated pattern of Flash 1, producing two exposures of the pattern portion of Flash 1 and additional pattern portions introduced by Flash 2. This process is repeated until the entire pattern is completed. Any given feature on the substrate is comprised of the sum of many exposures. FIG. 2B shows a final pattern exposure. Typically, the programmable phase array is stationary and the substrate is translated. The pattern on the programmable phase array is changed with each successive flash to account for the movement by the substrate stage and is shifted by a distance d divided by the phase pixel size. In typical exposures, total exposure at each point on the substrate is a result of the sum of a fixed number of flashes N.

Figure 3:
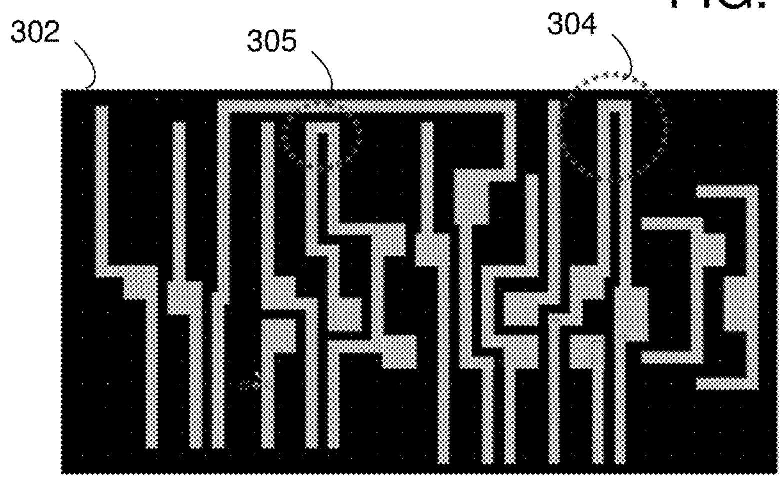

In some cases, phase conflicts complicate pattern transfer and can be eliminated or reduced with a sum-of-partially-coherent-image-exposures. FIG. 3 illustrates portions 304, 305 of a pattern 302 that are associated with phase conflicts. The pattern of FIG. 3 is taken from FIG. 2B. Phase conflicts occur at tied gates (at 304, 305) which define two hairpin features. Different phase assignments cannot be given to the gates without conflict due to the intersection of 0- and π-phases. Ideally, opposite phases should be assigned for the two gates, but the junction creates a phase conflict that results in an image discontinuity. FIG. 4A illustrates a pattern portion 400 that includes a checkerboard of 0 and π phase regions such as regions 402, 404. In FIG. 4A, 0-phase regions are shown as white, and π-phase regions are shaded. A circuit pattern is defined by pattern portions 406, 408 having π and 0 phase, respectively. FIG. 4B illustrates a result of substrate exposure with such patterns, showing an area 410 in which an intended exposure is not achieved. The above describes one example of many types of conflicts that can be encountered with strong phase-shift masks. Another common phase conflict occurs in pattern portions having a "T" shape.

Figure 5A:
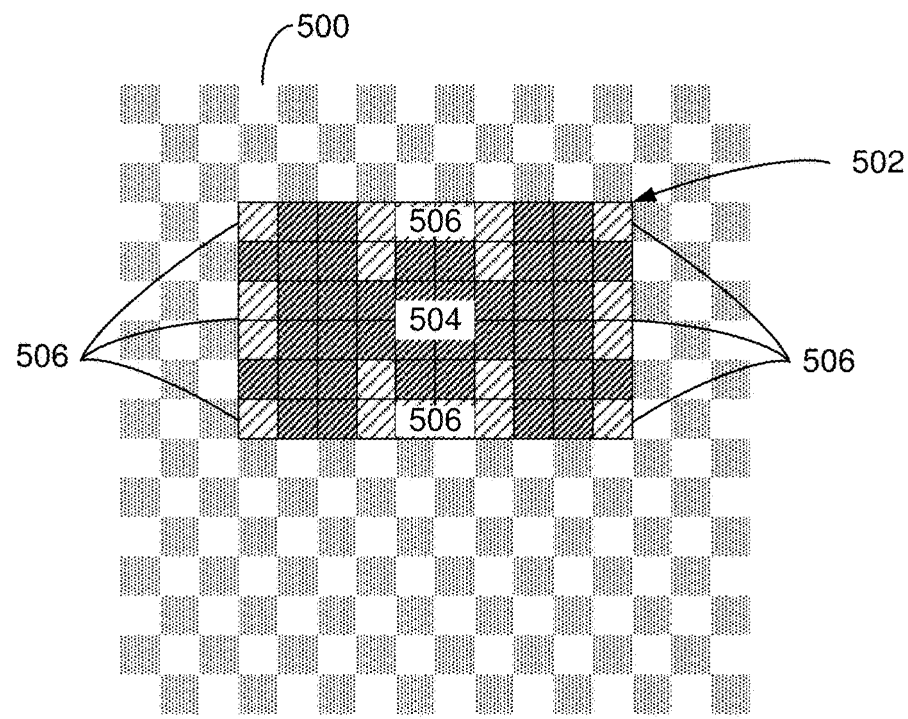
FIGS. 5A-5B illustrate a bridging phase mask and a corresponding exposure intensity.
Figure 5B:
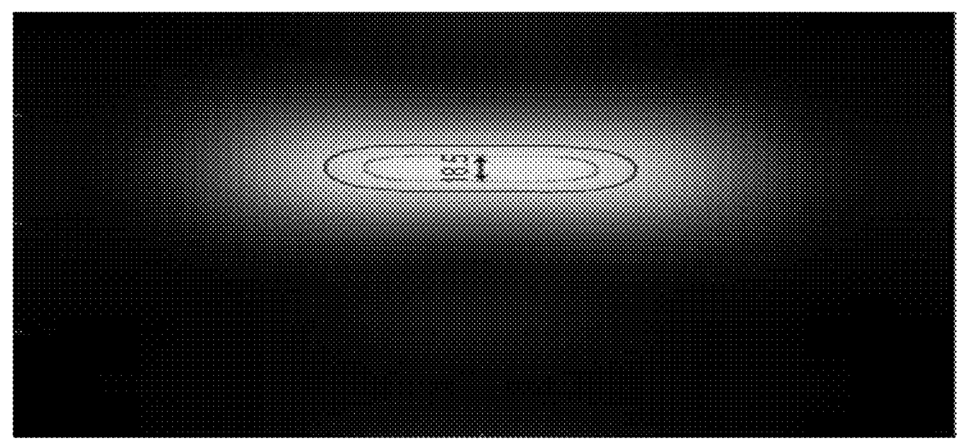

Such phase conflicts can be resolved using successive or multiple image patterns defined on a phase-pixelated array. The phase conflict occurring with the hairpin pattern shown in FIG. 4A can be resolved by using a flash (or sequence of flashes) that provides a bridging exposure to the top of the structure. A map and corresponding image used to resolve the phase conflict for subsequent flashes is shown in FIG. 5. A pattern portion 500 includes a checkerboard or mosaic of 0/π phase shift regions. A bridging pattern 502 includes a 0-phase portion 504 and π-phase portions 506. By exposing a substrate to a pattern such as that of FIG. 4A and that of FIG. 5A, a suitable substrate exposure is achieved as shown in FIG. 5B. Because the exposure using the pattern portion of FIG. 4A provides some exposure of a bridging region, typically the bridging pattern (FIG. 5A) can be used during 10-20% or less of the total exposure flashes. FIG. 6A illustrates an alternative pattern portion 600 that include 0-phase portion 604 and π-phase portions 606. This pattern produces a superior exposure to that of FIG. 4A, but still lacks suitable bridging exposure as shown in FIG. 6B.

Figure 7:
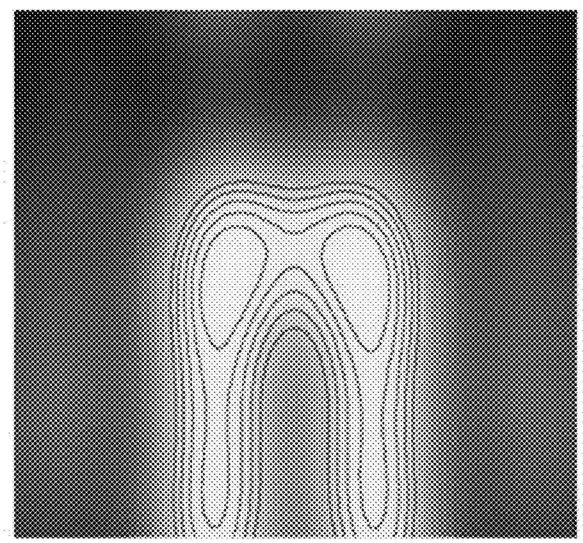
FIG. 7 illustrates an exposure intensity based on a bridging phase mask.

The numbers of flashes assigned to each pattern portion can be selected to achieve a preferred exposure. FIG. 6B shows an improvement in the initial flash pattern, shown in FIG. 4B, for constructing the two gates without the connecting section. The symmetry of the mask field is slightly different from the original, thereby requiring an offset to the pattern. This would similarly be compensated by using an optimization algorithm. However, the 2 gates still do not have a connection. In contrast, a resultant image for a modestly-optimized combination of two flashes using the pattern portions of FIG. 5A and FIG. 6A is shown in FIG. 7. In this combination, two flashes from FIG. 6A and only one flash for the connecting structure shown in FIG. 5A are used. In one simulation, the pixel size of the phase mask was 20 nm, and the pitch value (for the two bright spaces or gates) was 80 nm. A lens numerical aperture of 1.35 and imaging wavelength of 193 nm were used in this simulation. Also, any correction flash(es) may be generated at higher intensities in order to reduce the number flashes needed for applying corrections. This result can be improved by using an appropriate algorithm for image correction to the overlapping flashes, as described below. Further improvement can be obtained by applying optical proximity correction (OPC) to the image combination.

Mathematically, the net irradiance in the image plane for two exposures is given by the sum of their individual irradiance distributions:

$$I(x, y) = \sum_{m=1}^{M} \alpha_m |H_m(x, y) \otimes a(x, y)|^2 + \sum_{m=1}^{N} \lambda_m |G_m(x, y) \otimes b(x, y)|^2, \quad (1)$$

wherein a and b represent two mask transmission functions, $H_m$ and $G_m$ are corresponding sum of coherent images (SOCS) kernels (in the space domain), and $\{\alpha_m, m=1, \ldots, M\}$ and $\{\lambda_n, n=1, \ldots, N\}$ are the respective singular values. The operator $\otimes$ represents a convolution. In many cases, flash-to-flash exposure is the same and $H_m=G_m$.

Equation (1) essentially describes the forward model of the imaging system, given the 2 input mask functions a and b. Simultaneous optimization of these functions requires both a suitable metric or cost function for measuring the goodness of the estimates, $\hat{a}$ and $\hat{b}$, and a procedure for navigating through the solution space to find the best estimate. Such metrics or cost functions may optimize contour fidelity of resist features, process-window area, aerial-image contrast, critical-dimension (CD) errors, and so on. Various optimization algorithms that may be well-suited to the phase-shift DS problem include Projection on Convex Sets (POCS), pixel-flipping techniques, nonlinear programming, level-set methods, and gradient-based approaches. Global-optimization algorithms, such as simulated annealing (SA) or genetic algorithms (GA), are also options. However, considering the large number of variables (pixels) to be optimized, such algorithms may converge much too slowly for practical use. It would instead be preferred to implement direct optimization, where only downhill moves are accepted during the search process.

While Eq. (1) describes the image composite using only two mask functions, the problem can easily be extended to simultaneously optimize three or more flashes, although this increases the number of variables and therefore the computation time of the search process. Furthermore the fraction of each individual image can be weighted. In practice this weight would be different exposure time (a fraction of the total flashes), or a different pulse length of the exposing laser. This can be represented by the equation below:

$$I(x, y) = \sum_{i=1}^{Q} \left[ \sum_{m=1}^{M} w_i \alpha_{mi} |H_{mi}(x, y) \otimes a_i(x, y)|^2 \right], \quad (2)$$

where the equation has been written in its most general form. The convolution kernels in this equation, for each weighting term, can be different. This would imply a new illumination source shape for each weighting factor. However, when the illumination is constant and not varying in between exposures, $H_{mi}=H_m$ and $\alpha_{mi}=\alpha_m$.

Improvement of patterning fidelity and critical dimension uniformity may also be realized with weighted image summations to generate patterns. The problem with some implementations of digital scanning is that the pixel size of 20 nm and the restriction to only two phases do not allow for extensive correction of image fidelity and good control of CDs. Reducing the pixel size to 5 nm or 10 nm or even using up to four phases can improve pattern fidelity.

Figure 8:
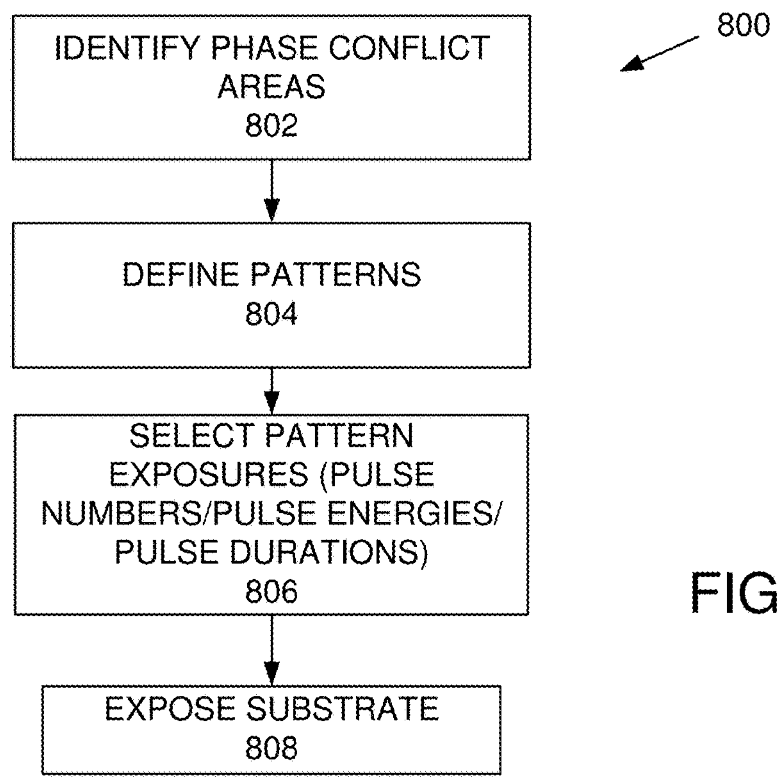
FIG. 8 illustrates a method of compensating phase conflicts.

A representative method 800 is shown in FIG. 8. At 802, phase conflict areas are identified and at 804, pattern portions are defined, including bridging pattern portions. At 806, numbers of exposures are selected for each pattern, and a substrate is exposed at 808.

Figure 9A:
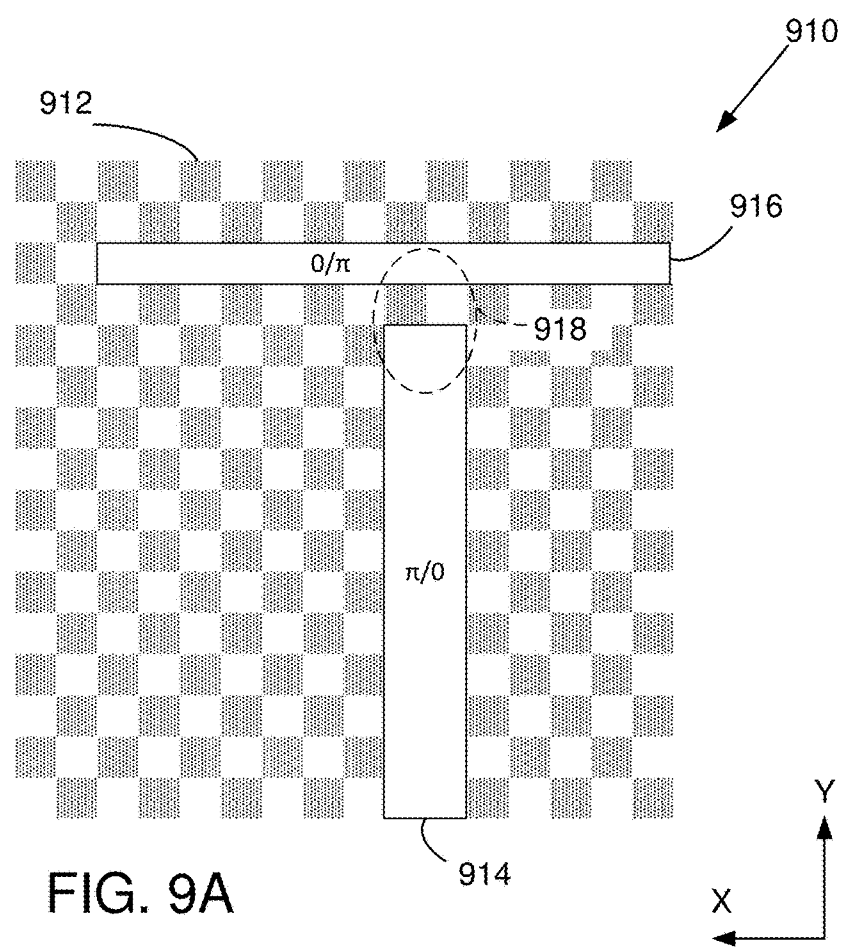

FIGS. 9A-9C illustrate additional phase patterns associated with pattern transfer using a digital phase mask. As shown in FIG. 9A, a phase map 910 associated with a first exposure includes phase pattern areas 914, 916 that define a T-shaped feature. A background phase pattern 912 includes pixels having alternating phase. The phase pattern areas 914, 916 have different phases, and a pattern region 918 is associated with a phase conflict. FIG. 9B illustrates a phase map 920 associated with a second exposure based on a bridging phase pattern 922 that is situated so as to connect the pattern features associated with phase pattern areas 914, 916. FIG. 9C is a schematic representation of the bridging phase pattern 922 showing a pattern area 930 having a 0-phase (or π-phase) and a pattern area 932 having a π phase (or a 0-phase), respectively. Relative positions of the exposures associate with phase pattern area 914, 916 are shown with dashed lines. As shown in FIG. 9B, pattern exposure is shifted along the X-axis a distance ΔX due to scanning so that the bridging phase pattern is properly aligned. In some examples, a bridging pattern is applied as a first exposure, followed by exposures of other pattern portions. Many shifts can be used as needed, depending on scan speed or required exposures. Alternatively, the bridging phase pattern may be exposed using another digital phase mask. For example, an exposure apparatus disclosed FIG. 12 of U.S. Pat. No. 8,405,816 B2 can be used for this purpose. Alternatively, the first and second exposures may be accomplished with raster scanning exposure methods such as disclosed in U.S. Pat. No. 8,089,616 B2. In other alternative, non-exclusive examples, the pulsed laser 102 used as a light source can be, for example a light emitting diode which emits pulsed light, or a solid-state pulsed laser light source which generates a harmonic of laser light output from a YAG laser or a solid-state laser (semiconductor laser or the like). The solid-state pulsed laser light source can emit pulses of laser light, e.g., at a wavelength of 193 nm (or any one of various wavelengths) with the pulse widths of about 1 ns, at a frequency of approximately 1-2 Hz.

Figure 10:
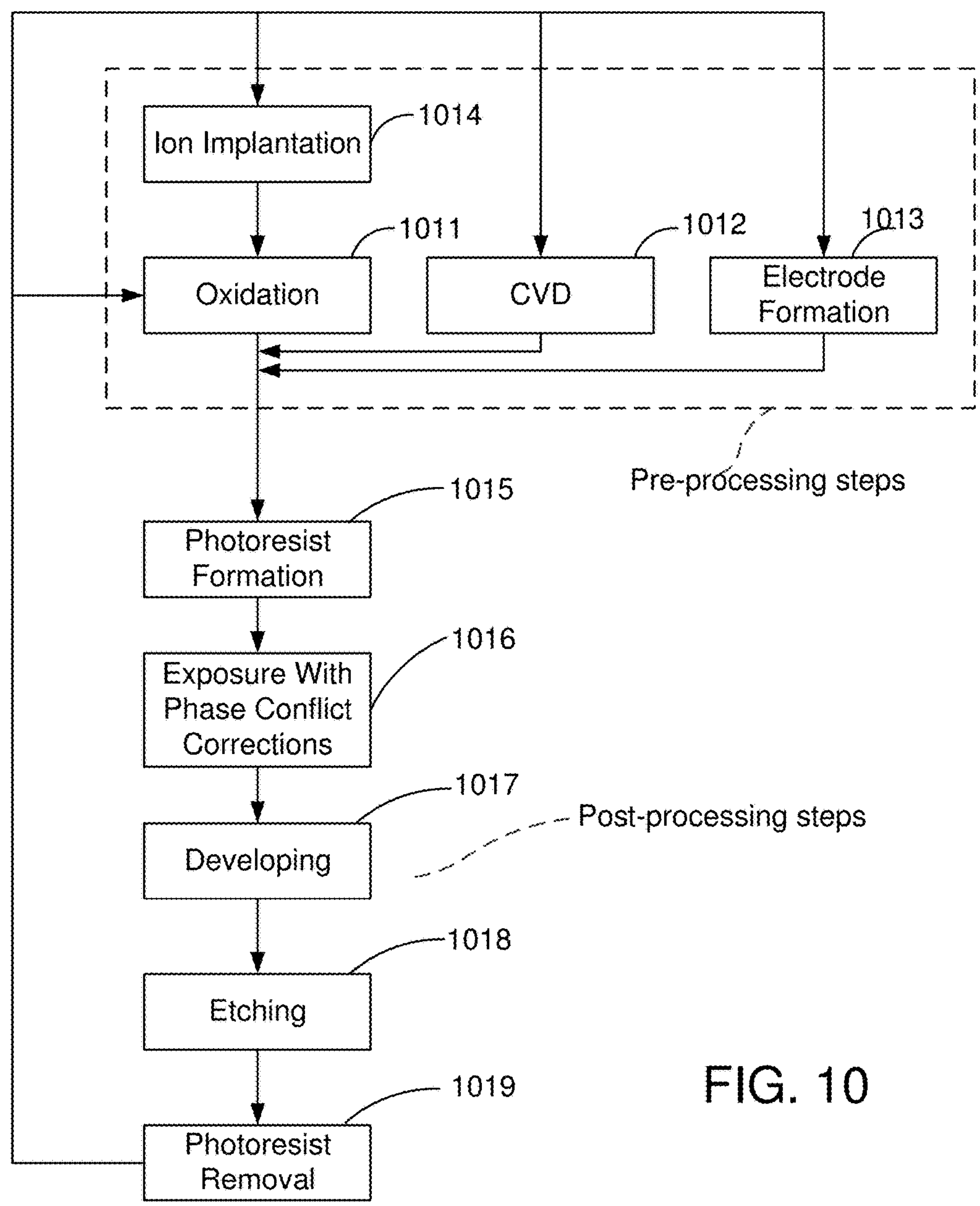
FIG. 10 illustrates a representative manufacturing method.

Representative details of a wafer-processing process including a microlithography step are shown in FIG. 10. In step 1011 ("oxidation") the wafer surface is oxidized. In step 1012 ("CVD") an insulative layer is formed on the wafer surface by chemical-vapor deposition. In step 1013 (electrode formation) electrodes are formed on the wafer surface by vapor deposition, for example. In step 1014 ("ion implantation") ions are implanted in the wafer surface. These steps 1011-1014 constitute representative "pre-processing" steps for wafers, and selections are made at each step according to processing requirements.

At each stage of wafer processing, when the pre-processing steps have been completed, the following "post-processing" steps are implemented. A first post-process step is step 1015 ("photoresist formation") in which a suitable resist is applied to the surface of the wafer. Next, in step 1016 ("exposure"), the dithered exposure systems and methods described above are used for transferring a pattern from the phase array to the resist layer on the wafer. In step 1017 ("developing") the exposed resist on the wafer is developed to form a usable mask pattern, corresponding to the resist pattern, in the resist on the wafer. Bridging and other phase-conflict resolution patterns can be used. In step 1018 ("etching"), regions not covered by developed resist (i.e., exposed material surfaces) are etched away to a controlled depth. In step 1019 ("photoresist removal"), residual developed resist is removed ("stripped") from the wafer. Formation of multiple interconnected layers of circuit patterns on the wafer is achieved by repeating the pre-processing and post-processing steps as required. Generally, a set of pre-processing and post-processing steps are conducted to form each layer.

Figure 11:
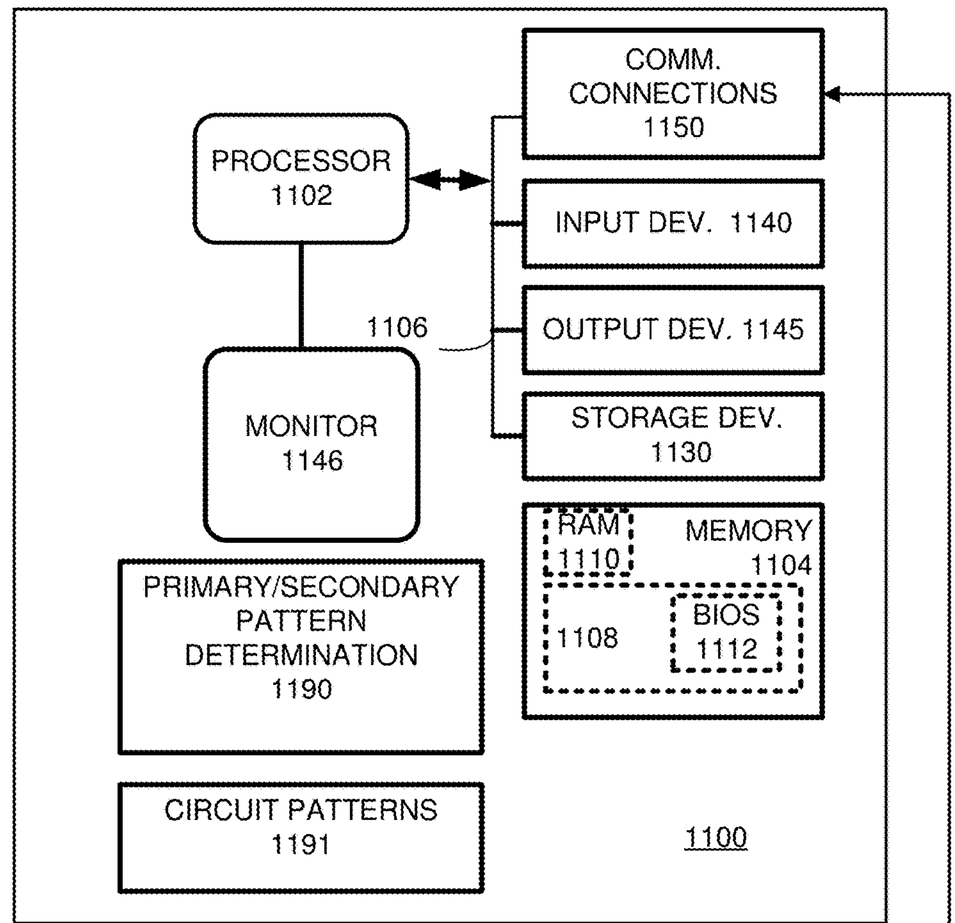
FIG. 11 illustrates a representative computing environment for determining primary and secondary phase masks for regions associated with phase conflict.

FIG. 11 and the following discussion are intended to provide a brief, general description of an exemplary computing environment in which the disclosed technology may be implemented. Although not required, the disclosed technology is described in the general context of computer-executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 11, an exemplary system for implementing the disclosed technology includes a general purpose computing device in the form of an exemplary conventional PC 1100, including one or more processing units 1102, a system memory 1104, and a system bus 1106 that couples various system components including the system memory 1104 to the one or more processing units 1102. The system bus 1106 may be any of several types of bus structures including a memory bus or memory controller, a peripheral bus, and a local bus using any of a variety of bus architectures. The exemplary system memory 1104 includes read only memory (ROM) 1108 and random access memory (RAM) 1110. A basic input/output system (BIOS) 1112, containing the basic routines that help with the transfer of information between elements within the PC 1100, is stored in ROM 1108. Typically one or more storage devices or a memory such as memory 1190, or a communication connection is coupled to store or communicate pattern definitions and first and second phase patterns and associated exposures. The memory 1190 can also include computer-executable instructions for dividing a pattern is sets of primary and dithered exposures, and in some examples, these exposures are based on photoresist characteristics so as to achieve a preferred exposure. Circuit patterns can be stored in a memory 1191 and retrieved so as to determine the phase patterns needed for pattern transfer.

The exemplary PC 1100 further includes one or more storage devices 1130 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1106 by a hard disk drive interface, a magnetic disk drive interface, and an optical drive interface, respectively. The drives and their associated computer-readable media provide nonvolatile storage of computer-readable instructions, data structures, program modules, and other data for the PC 1100. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1130 including an operating system, one or more application programs, other program modules, and program data. A user may enter commands and information into the PC 1100 through one or more input devices 1140 such as a keyboard and a pointing device such as a mouse. Other input devices may include a digital camera, microphone, joystick, game pad, satellite dish, scanner, or the like. These and other input devices are often connected to the one or more processing units 1102 through a serial port interface that is coupled to the system bus 1106, but may be connected by other interfaces such as a parallel port, game port, or universal serial bus (USB). A monitor 1146 or other type of display device is also connected to the system bus 1106 via an interface, such as a video adapter. Other peripheral output devices, such as speakers and printers (not shown), may be included.

The PC 1100 may operate in a networked environment using logical connections to one or more remote computers, such as a remote computer 1160. In some examples, one or more network or communication connections 1150 are included. The remote computer 1160 may be another PC, a server, a router, a network PC, or a peer device or other common network node, and typically includes many or all of the elements described above relative to the PC 1100, although only a memory storage device 1162 has been illustrated in FIG. 11. The personal computer 1100 and/or the remote computer 1160 can be connected to a logical a local area network (LAN) and a wide area network (WAN). Such networking environments are commonplace in offices, enterprise-wide computer networks, intranets, and the Internet.

When used in a LAN networking environment, the PC 1100 is connected to the LAN through a network interface. When used in a WAN networking environment, the PC 1100 typically includes a modem or other means for establishing communications over the WAN, such as the Internet. In a networked environment, program modules depicted relative to the personal computer 1100, or portions thereof, may be stored in the remote memory storage device or other locations on the LAN or WAN. The network connections shown are exemplary, and other means of establishing a communications link between the computers may be used. As shown in FIG. 11, a digital phase mask based pattern transfer system 1163 is connected to the remote computer 1160 and the computer 1100 for communication of circuit patterns, phase patterns, exposures, exposure sequences and the other pattern transfer specifications.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. An exposure apparatus which exposes a workpiece with an exposure light from a light source, comprising:

- a spatial light modulator including a plurality of optical elements situated in an optical path of the exposure light; and
- a controller which is configured to control the spatial light modulator so as to set each of the plurality of optical elements of the spatial light modulator to a first state or a second state,
- wherein the controlling comprises:
  - setting an optical element from the plurality of optical elements positioned in a first area of the spatial light modulator to the first state so as to expose a first exposure region on the workpiece with a first exposure light from the optical elements in the first area;
  - setting an optical element from the plurality of optical elements positioned in a second area of the spatial light modulator to the second state so as to expose a second exposure region on the workpiece with a second exposure light from the optical element in the second area, wherein the second area partially adjoins the first area, and wherein the first exposure region and the second exposure region on the workpiece are not adjacent; and setting a first group of optical elements from the plurality of optical elements positioned in a third area of the spatial light modulator that includes an area where the first area and the second area are in contact to the first state, and a second group of optical elements from the plurality of optical elements positioned in the third area to the second state, so as to expose a third exposure region on the workpiece between the first exposure region and the second exposure region with a third exposure light.

2. The exposure apparatus of claim 1, wherein the controlling further comprises exposing the third exposure region before or after the first and second exposure regions are exposed.

3. The exposure apparatus of claim 1, wherein the light source includes a pulsed laser that emits light pulses, and wherein the controlling further comprises setting the optical element positioned in the first area to the first state and the optical element positioned in the second area to the second state while M light pulses irradiate the first area and the second area of the spatial light modulator, and setting the first group of optical elements positioned in the third area to the first state and the second group of optical elements positioned in the third area to the second state while N light pulses irradiate the spatial light modulator, wherein M and N are integers.

4. The exposure apparatus of claim 3, wherein the M is greater than N.

5. The exposure apparatus of claim 1, wherein the first exposure light and the second exposure light have different phases.

6. The exposure apparatus of claim 1, wherein the exposure light received from the optical element in the first state and the exposure light received from the optical element in the second state have a phase difference at the workpiece.

7. The exposure apparatus of claim 6, wherein the exposure light from the optical element in the first state and the exposure light from the optical element in the second state interfere destructively.

8. The exposure apparatus of claim 1, wherein each of the plurality of optical elements is a reflective optical element.

9. The exposure apparatus of claim 8, wherein the first state is a state in which the associated reflective optical element is in a first position along the optical path of the exposure light, and the second state is a state in which the associated reflective element is in a second position along the optical path of the exposure light.

10. An exposure method which exposes a workpiece with an exposure light from a plurality of optical elements of a programmable array, the method comprising:

setting an optical element from the plurality of optical elements positioned in a first area of the programmable array to a first state so as to expose a first exposure region on the workpiece with a first exposure light from the optical element in the first area;

setting an optical element from the plurality of optical elements positioned in a second area of the programmable array to the second state so as to expose a second exposure region on the workpiece with a second exposure light from the optical element in the second area; and setting a first group of optical elements from the plurality of optical elements positioned in a third area of the programmable array that includes a part of the first area and a part of the second area to the first state, and a second group of optical elements from the plurality of optical elements positioned in the third area to the second state, so as to expose a third exposure region of the workpiece situated between the first exposure region and the second exposure region with a third exposure light.

11. A device manufacturing method comprising:

forming a patterned photosensitive layer on a workpiece using the exposure method of claim 10; and processing the workpiece on which the patterned photosensitive layer is formed.

12. The exposure apparatus of claim 1, wherein the first group of optical elements and the second group of optical elements form a bridging pattern, comprising:

the first group of optical elements form a first bridging portion configured to expose the third exposure region with exposure light having a first phase, and the second group of optical elements form a second bridging portion configured to expose the third exposure region with exposure light having a second phase that is different from the first phase.

13. The exposure apparatus of claim 12, wherein each of the optical elements of the first group of optical elements have a first orientation and each of the optical elements of the second group of optical elements have a second orientation.

14. The exposure apparatus of claim 12, wherein:

each of the optical elements of the first group of optical elements in the first portion is contiguous with at least one other of the optical elements of the first group of optical elements; and at least some of the optical elements from second group of optical elements in the second portion are separated from other optical elements of the second group of optical elements by at least one of the first group of optical elements.

15. The exposure apparatus of claim 1, wherein the third exposure region comprises a bridging exposure between the first exposure region and the second exposure region on the workpiece.

16. An exposure method which exposes a workpiece with an exposure light from a plurality of optical elements of a programmable array, the method comprising:

setting an optical element from the plurality of optical elements positioned in a first area of the programmable array to a first state so as to expose a first exposure region on the workpiece with a first exposure light from the optical element in the first area;

setting an optical element from the plurality of optical elements positioned in a second area of the programmable array to the second state so as to expose a second exposure region on the workpiece with a second exposure light from the optical element in the second area, wherein the first area and the second area are at least partially adjacent, and wherein the first exposure region and the second exposure region are not at least partially adjacent; and in a third area of the programmable array which includes a part of the first area and a part of the second area, forming a bridging pattern by setting a first group of optical elements from the plurality of optical elements to the first state and a second group of optical elements from the plurality of optical elements to the second state, so as to expose a third exposure region of the workpiece situated between the first exposure region and the second exposure region with a third exposure light.

17. The exposure method of claim 16, wherein the third exposure region comprises a bridging exposure between the first exposure region and the second exposure region on the workpiece.

* * * * *